(12) United States Patent
Huppertz

(10) Patent No.: US 7,821,434 B2
(45) Date of Patent: Oct. 26, 2010

(54) APPARATUS AND METHOD FOR EFFICIENT ANALOG-TO-DIGITAL CONVERSION

(75) Inventor: Juergen Huppertz, Dulsburg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 29 days.

(21) Appl. No.: 12/277,492

(22) Filed: Nov. 25, 2008

(65) Prior Publication Data
US 2009/0135033 A1 May 28, 2009

(30) Foreign Application Priority Data
Nov. 26, 2007 (DE) .................. 10 2007 056 732

(51) Int. Cl.
*H03M 1/10* (2006.01)
(52) U.S. Cl. .................. 341/120; 341/117; 341/118; 341/119; 341/155
(58) Field of Classification Search ......... 341/117–120, 341/131, 155; 250/338.1
See application file for complete search history.

(56) References Cited

U.S. PATENT DOCUMENTS

| | | | |
|---|---|---|---|
| 4,796,296 A * | 1/1989 | Amada et al. ........... 379/406.06 |
| 5,646,622 A | 7/1997 | Kuttner | |
| 5,844,514 A | 12/1998 | Ringh et al. | |
| 6,229,466 B1 * | 5/2001 | Gattani ................... 341/120 |
| 6,486,811 B2 | 11/2002 | Clara et al. | |
| 6,556,158 B2 * | 4/2003 | Steensgaard-Madsen .... 341/131 |
| 6,690,013 B2 * | 2/2004 | McManus ................. 250/338.1 |
| 6,784,820 B1 * | 8/2004 | Casalegno et al. .......... 341/155 |
| 7,002,417 B2 * | 2/2006 | Maunuksela et al. ......... 331/17 |
| 7,105,818 B2 * | 9/2006 | Anderson et al. ......... 250/338.1 |

FOREIGN PATENT DOCUMENTS

| | | |
|---|---|---|
| DE | 2 209 413 A | 9/1973 |
| DE | 38 36 823 A1 | 5/1990 |
| DE | 288 046 A5 | 3/1991 |

OTHER PUBLICATIONS

English translation of the official communication issued in counterpart German Application No. 10 2007 056 732.6, mailed on Sep. 23, 2008.
Huppertz; "Concept for Determining a Measurement Value at a Component"; U.S. Appl. No. 12/277,479, filed Nov. 25, 2008.
Nowicki: "Calorimeter for Absolute Laser C.W. Radiation-Power Measurements," Electronics Letters 1967; vol. 3, No. 11; Sep. 25, 1967; pp. 474-475.
English translation of the official communication issued in counterpart German Application No. 10 2007 056 731.8, mailed on Jul. 30, 2008.

* cited by examiner

*Primary Examiner*—Jean B Jeanglaude
(74) *Attorney, Agent, or Firm*—Keating & Bennett, LLP

(57) ABSTRACT

For digitizing analog measurement signals, an analog-to-digital converter is used, wherein the offset to be subtracted from an analog measurement value is taken to account within a locked loop by means of which an analog-to-digital converter operating according to the modulation principle is fed back.

25 Claims, 5 Drawing Sheets

APPARATUS AND METHOD FOR EFFICIENT ANALOG-TO-DIGITAL CONVERSION

CROSS-REFERENCE TO RELATED APPLICATIONS

This application claims priority from German Patent Application No. 102007056732.6, which was filed on Nov. 26, 2007, and is incorporated herein in its entirety by reference.

BACKGROUND OF THE INVENTION

The present invention concerns an efficient implementation of an analog-to-digital converter, and particularly the fact how a signal imparted with high offset may be digitized efficiently and with high accuracy by analog-to-digital conversion.

In a multiplicity of practical applications, it is essential to determine and digitize a small signal proportion imparted with high, approximately constant offset. This entails a series of problems. For example, if such a signal is digitized with a conventional sigma-delta converter (ΣΔconverter), a pulse sequence of very high density would result. Since the offset itself also has to be measured in addition to the signal proportion of interest located on the offset, and the accuracy needed is determined by the signal proportion located on the offset, the accuracy of the converter would have to be very high. This is due to the fact that the offset signal including no information would have to be digitized with the same accuracy as the signal part located on the offset. This would either necessitate a multi-bit analog-to-digital (AD) conversion or very high oversampling. There are technological boundaries for both alternatives, however. On the one hand, multi-bit converters, such as Flash ADCs, which may digitize the signal in a single conversion step, are extremely expensive, since they need a comparator for each resolution stage, and further are allowed to have only few errors between the stages. This leads to the fact that energy consumption increases heavily with growing resolution, on the one hand, and that a lot of chip area is needed to implement such a converter, on the other hand.

This leads to problems in integrated designs, particularly in applications where the digitization takes place on the chip of a sensor. The increase of the sample frequency, which basically would enable using a converter with lower resolution, is also faced with technological boundaries. Particularly in the case of the increase of the clock frequency, the current consumption rises with the number of switching processes, so that heat development also increases to the same extent. In applications in which the converter is attached in direct geometrical proximity to a sensor element, this may lead to a no-longer-tolerable corruption of the measurements results due to the additional heat input by the additionally introduced heat of the ADC conversion through heating of the converter.

In the following, the readout of a bolometer is to serve as an example for the readout of a sensor. A bolometer serves for measuring heat by absorbing electromagnetic radiation in the bolometer, whereby the temperature of the bolometer rises. By using a temperature-dependent device, the change in the temperature is converted into an electrical signal. Here, for example, resistive elements well insulated thermally from the environment are used in a vacuum, the electrical resistance thereof changing with the heating. The temperature changes through the incident heat radiation are very small, however. Temperature differences of less than 1 mK have to be resolved for the measurement. In the case of the resistance measurement, for example, a constant voltage may be applied to the resistive element, so that the thermally induced resistance change causes a minimally changing current flow to be measured. An offset current large as compared with the thermally induced current changes will already flow due to the intrinsic resistance of the resistive element, however, when applying a voltage. The electrical signal thus is superimposed by a very high offset.

The current often is measured by a bolometer in the above-described configuration with a sigma-delta converter. The offset here is subtracted in different ways. For example, so-called blind bolometers, i.e. bolometers shielded from the incident electromagnetic radiation and well connected thermally to the substrate through which the offset-forming current flows, often are used. The current of the blind bolometer may be subtracted from the current of the sensitive bolometer prior to the analog-to-digital conversion (AD). Typically, the bolometer resistances of the individual bolometers of a bolometer sensor array deviate strongly from each other for manufacturing reasons, however, so that the currents flowing through the bolometer have to be equalized prior to measurement. To this end, in the common implementations, the voltages across the active and blind bolometers are adjusted via DA-converters. For this purpose, some readout circuits use transistors located in the pixels of the bolometer array and the gate voltages of which are capable of being adjusted with a DA-converter. In such a solution, the transistor used for equalizing is not within a locked loop, however, so that deviations may occur easily. The threshold voltage of a transistor is temperature-dependent. Thereby, drifting of the voltage may occur. In the above-described method, an AD converter is used for generating the actual measuring signal. This is problematic, among other things, since the voltage corresponding to the LSB is not identical when using two different converters, so that the determination of the measuring quantity takes place with a precision different from that of the offset compensation.

For bolometer arrays, or generally for sensor arrays, it holds true that the pixels of the sensor array typically are read out sequentially. For example, if an analog-to-digital converter sensor column or sensor row is used, the ADC converter has to be constructed in a very simple way. In particular, multi-stage or multi-bit ADCs are to be avoided, since they need too much chip area, on the one hand, and entail significant heat input in the sensor, on the other hand. If the principle of the sigma-delta conversion is used, the ADC used within the sigma-delta circuit thus should be constructed in a very simple way, i.e. ideally have a resolution of only one bit. When reading out bolometers, in particular, there arises the problem of additional heating through the readout electronics used on the bolometer chip. The electrically introduced power inevitably leads to the fact that the chip itself heats up because of the readout circuit. The generally undesirable property is aggravated further by the fact that the amplifiers or ADCs are arranged on one side of the chip, since the one-sided heat input leads to heat gradients on the chip.

Although 2.5 bits of resolution could be gained when doubling the oversampling ratio of a sigma-delta converter with a second-order modulator, the increase of the oversampling ratio is especially critical, for example in the bolometer readout, since the loss heat generated by the readout circuit increases heavily thereby. This should be compensated for by a simplification of the remaining devices being part the circuit, in order to keep the loss power introduced by the readout circuit on an acceptable level altogether.

SUMMARY

According to an embodiment, an analog-to-digital converter may have: a compensator for imparting an analog measured quantity with a correction quantity dependent on a combination signal to form a changed measured quantity; an analog filter for filtering the changed measured quantity to acquire a filtered measured quantity; a digitizer to generate a digital value dependent on the filtered measured quantity; and a feedback unit to form the combination signal by combination of a digital calibration value and the digital value.

According to another embodiment, a method for analog-to-digital conversion may have the steps of: imparting an analog measured quantity with a correction quantity dependent on a combination signal, to form a changed measured quantity; analog filtering of the changed measured quantity to acquire a filtered measured quantity; generating a digital value depending on the filtered measured quantity; and generating the combination signal by combination of a digital calibration value and the digital value.

According to another embodiment, a bolometer sensor may have a sensor element for generating an analog measured quantity depending on received heat radiation; and an analog-to-digital converter having a compensator for imparting an analog measured quantity with a correction quantity dependent on a combination signal to form a changed measured quantity; an analog filter for filtering the changed measured quantity to acquire a filtered measured quantity; a digitizer to generate a digital value dependent on the filtered measured quantity; and a feedback unit to form the combination signal by combination of a digital calibration value and the digital value.

In some embodiments of the present invention, an analog-to-digital converter in which the offset can be subtracted from an analog measurement value is taken into account within a locked loop by means of which an analog-to-digital converter operating in accordance with the modulation principle is fed back.

In one embodiment of the present invention, an ADC and a DAC working in accordance with the sigma-delta ($\Sigma\Delta$) method each are combined, so that an analog offset generated by means of the DAC and having to be taken into account in the measurement of an analog measured quantity is taken into consideration in the feedback loop of the sigma-delta ADC.

In a further embodiment of the present invention, a correction quantity containing a combination and feedback proportions is formed by combination of the signals of a plurality of the signal generators, a selected number of which are combined depending on the amount of the correction quantity needed, to generate the correction quantity. In one embodiment of the present invention in which a current is to be generated as correction quantity, the signal generators are capacitors of approximately identical capacitance and/or current sources or sinks of identical current strength. In a further embodiment of the present invention, a resistor matrix can be used, the individual resistors of which can be combined and/or connected in series arbitrarily. In a further embodiment of the present invention, a multiplicity of voltage sources capable of being connected in series in any combination to generate a correction quantity of a varying amount is used.

In a further embodiment of the present invention, a plurality of signal generators are controlled such that, given the same desired number of signal generators to be combined each, different combinations of the signal generators are used in various readout cycles, so as to mask production-induced differences of the operating parameters of the individual signal generators. To this end, in some embodiments of the present invention, an analog-to-digital conversion is performed with significantly higher frequency than the typical frequency of change of the analog measurement signals (oversampling), so that the statistical variations due to different operating parameters of the individual signal generators are averaged out or compensated for already within a single measurement cycle with a multiplicity of AD conversions.

In a further embodiment of the present invention, the feedback signal returned from the analog-to-digital conversion is added with a calibration signal describing the mean offset to be expected in the feedback circuit of the ADC, so as to determine the combination signal therefrom. Hence, both the feedback and the offset compensation are performed with identical quantization. This means the values of individual bits of the feedback and of the offset compensations exactly correspond to identical signal proportions of the analog measured quantities, whereby a mismatch is prevented.

According to a further embodiment of the present invention, an analog-to-digital converter is used for reading out a bolometer in which an offset value is fed into the feedback branch of the ADC. This also allows for determining, beyond the mere analog-to-digital conversion, how much energy has been supplied to the bolometer during the readout. In particular, this is relevant for the readout of a bolometer, since the bolometer itself heats up during the readout due to the supplied electrical energy, which may lead to corruption of measurement results. By using the feedback ADC, the supplied energy can be determined by counting quantized signal proportions used of the individual signal generators, so that these can be taken into account computationally in the evaluation of the bolometer signal. In addition, it thereby becomes possible to supply a blind bolometer used for comparison purposes with exactly the same energy amount when operating further the ADC associated with the comparison bolometer until the energy supplied to the comparison bolometer corresponds to the energy supplied to the bolometer to be measured. This may also be expanded to all bolometers of an area, so that each bolometer is supplied with the same energy. This is easily possible by using the quantized signal portions in some embodiments of the invention.

BRIEF DESCRIPTION OF THE DRAWINGS

Embodiments of the present invention will be detailed subsequently referring to the appended drawings, in which.

DETAILED DESCRIPTION OF THE INVENTION

For illustrating the concept on digital-analog conversion, the principle of $\Sigma\Delta$ analog-to-digital and digital-to-analog conversion will be presented briefly in the following on the basis of FIGS. 1a and 1b. On the basis of FIG. 1c, it will be described how the ADC and DAC converters of FIGS. 1a and 1b may be combined so as to obtain an embodiment of an analog-to-digital converter.

Figure 1A:
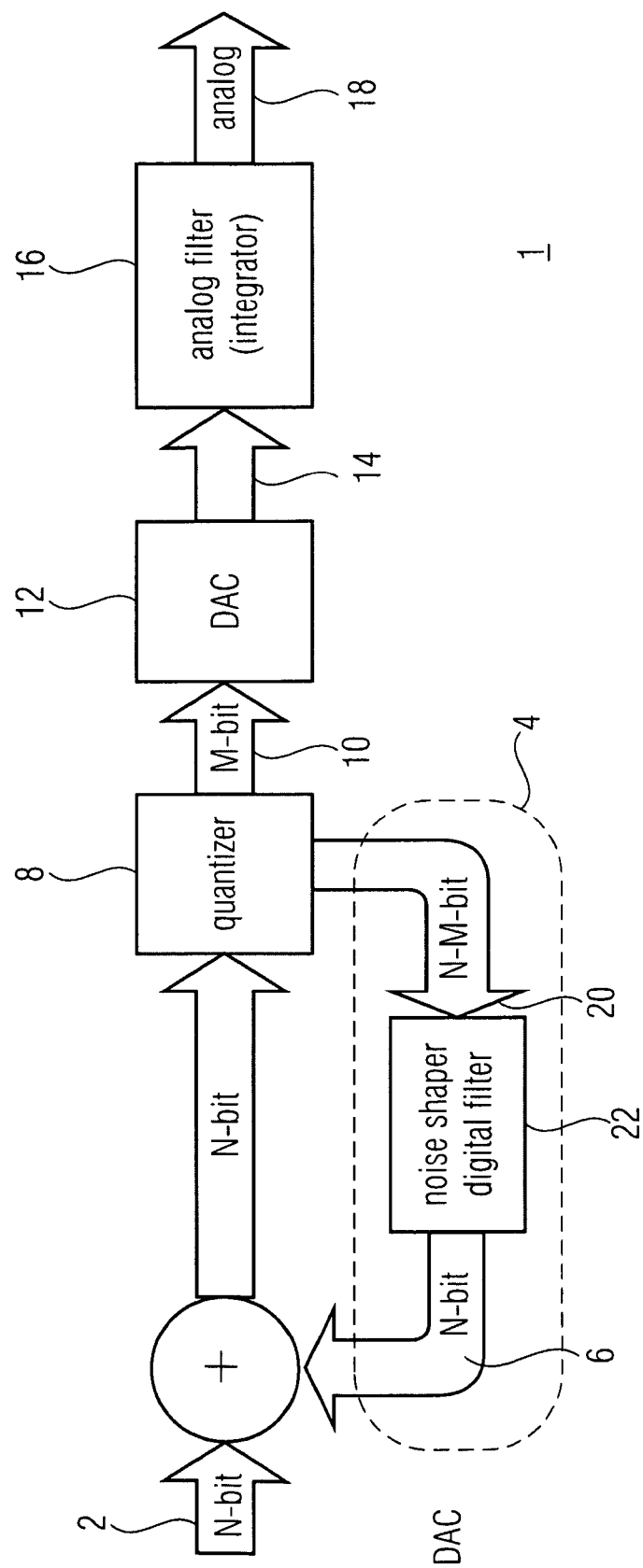
FIG. 1a is a block circuit diagram of a digital-analog converter.

FIG. 1a shows a digital-to-analog converter (DAC) converting an N-bit signal into an analog output signal.

An N-bit signal 2 is made available at the input of the DAC 1 and added to a second N-bit signal 6, generated in a feedback loop 4 of the DAC 1. The added signal is quantized by a quantizer 8, so as to obtain an N-bit signal 10 of lower resolution, which means a signal reproducing the N-bit signal 2 with reduced accuracy. This often is needed for efficiency reasons so as to be able to use a digital-to-analog converter 12 (DAC), which performs the actual conversion of the signal for generating the analog signal. This is desirable since multi-bit DACs have a great number of devices, i.e. thus consume a lot of energy and chip area. Here, it also has to be guaranteed that the devices deviate only slightly, or corresponding compensation means are present.

The M-bit DAC 12 generates an analog output signal 14, which may usually have a number of discrete signal peaks (for example, voltages or currents) corresponding to the resolution of the DAC 12. So as to convert these stepped analog signals, which may change unsteadily with the clock signal DAC 12, into steady signals, or to ensure a smooth signal course, the analog output signal 14 is filtered by an analog filter 16, for example, an integrator. The analog signal 18 thus generated may now be used further in the analog domain.

So that no deterioration in signal quality due to the quantization of the quantizer 8 has to be accepted, the quantization error 20 (N-M bit signal) is fed back onto the digital input signal 2 by means of a noise-shaping digital filter 22 in known manner.

A DAC circuit in accordance with to the sigma-delta modulation principle, as shown in FIG. 1a, may for example be used to compensate, or subtract prior to a subsequent digital-to-analog conversion, an offset, i.e. a continuous signal proportion not of interest of an analog measurement signal. To this end, the digital-to-analog converter is controlled with the N-bit signal 2, which reflects the expected offset in digital form. The analog signal 18 may then be subtracted from the measurement signal. Through variation of the N-bit signal 2, a changing offset can be taken into account.

Figure 1B:
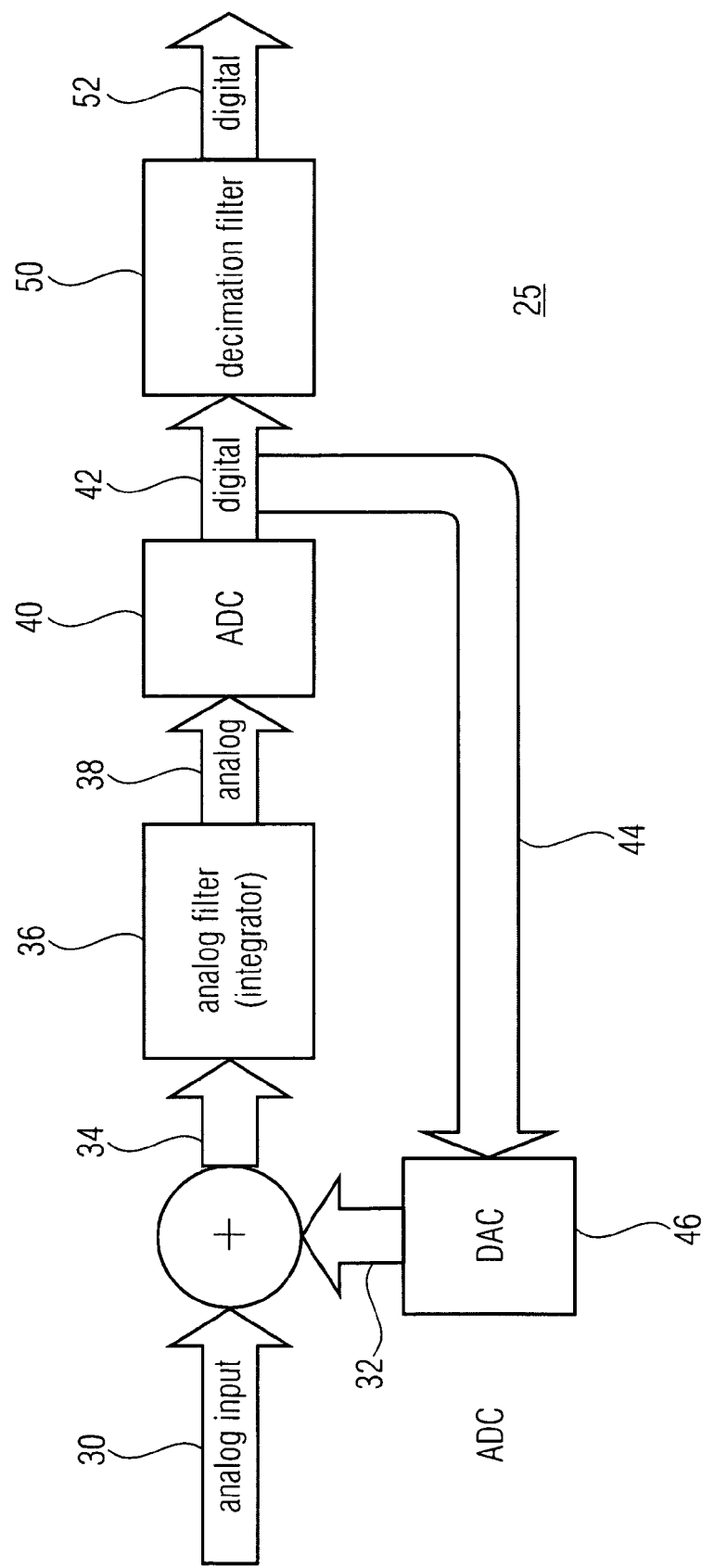
FIG. 1b is a block circuit diagram of an analog-digital converter.

FIG. 1b shows an analog-to-digital converter 25 working in accordance with the sigma-delta modulation principle and usable to digitize an analog measuring quantity 30, for example, after an offset has been subtracted by means of the digital-to-analog converter shown in FIG. 1a.

An analog measurement signal 30 is added with an analog feedback signal 32 to supply an analog filter 36 with a combined signal 34 thus generated. In the sigma-delta modulation, the analog filter 36 typically is an integrator, which may be formed to be one or multi-stage. The filtered combined signal 38 is supplied to the actual analog-to-digital converter 40, which generates a digital output signal 42. The quantization error inevitably accompanied thereby is fed back onto the input of the analog-to-digital converter 25 via a feedback signal 44 and a digital-to-analog converter 46 controlled by the feedback signal 44. Depending on the digitization error caused in the respective clock step of the ADC, a respectively different analog signal, which is added to the analog input signal 30, is generated by the DAC 46. In the simplest case, it is decided as to whether the digitization error is positive or negative, so that a negative signal of predetermined amplitude is generated by the DAC 46 in the first case, whereas a positive signal is generated by the DAC 46 and fed back onto the input of the ADC of FIG. 1b in the latter case.

The ADC 40 as well as the feedback loop usually are operated at a frequency by far exceeding the signal frequency (oversampling), i.e. the frequency at which the analog input signal 30 changes. Due to the feedback, the digital representation 42 of the input signal and/or the digital signal on average corresponds to the analog input signal 30, even if the quantization errors described may result per cycle. This fact is utilized by reducing the digital signal 42 generated by means of a comparatively low-resolution ADC 40 by a decimation filter 50 to a digital output signal 52 available at the output of the ADCs of FIG. 1b with a reduced frequency, but with higher resolution than the digital signal 42.

Figure 1C:
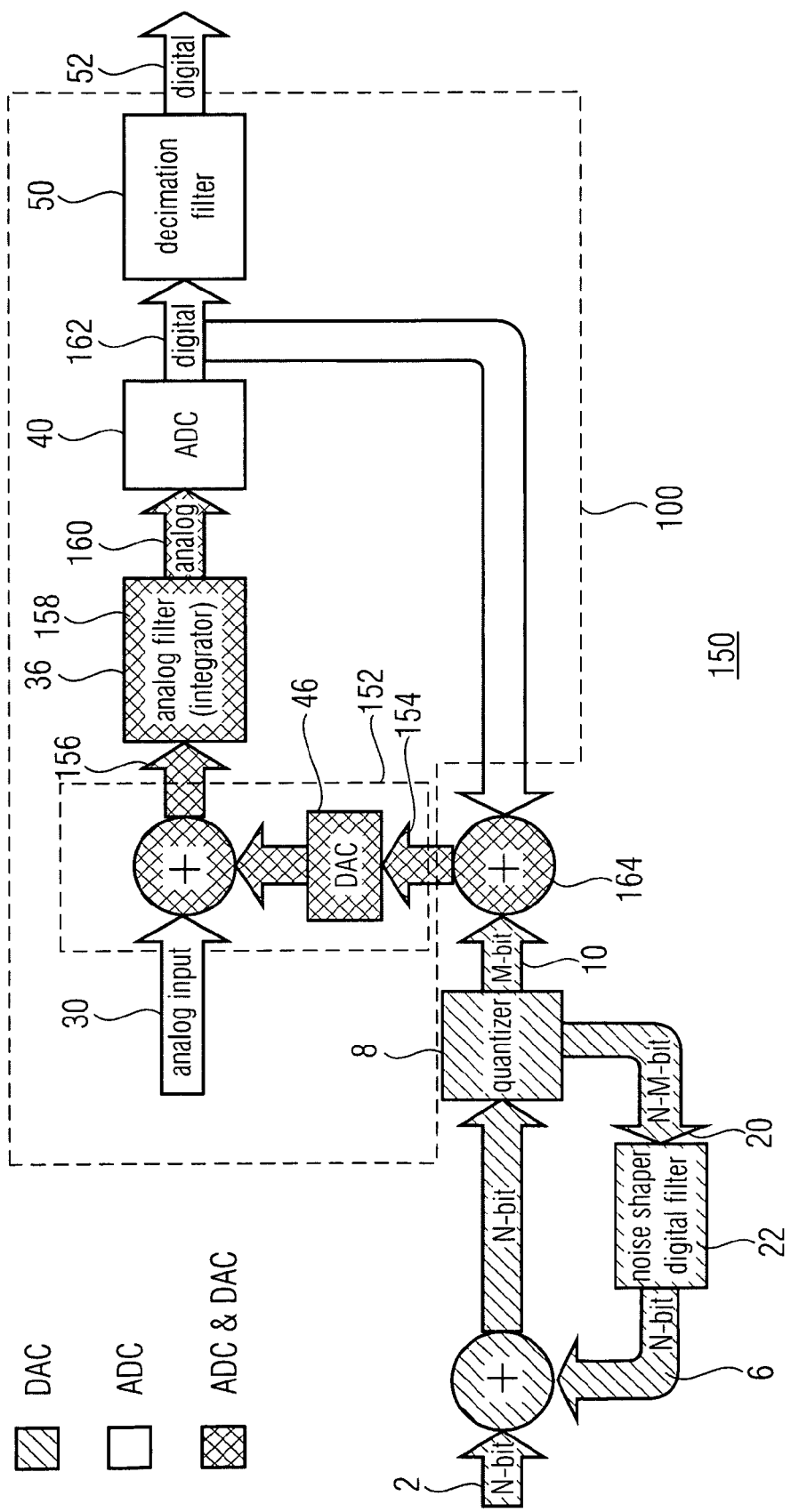
FIG. 1c shows an embodiment of an analog-to-digital converter.

FIG. 1c shows how a concept for an evaluation circuit combining a ΣΔ DAC and a ΣΔ ADC can be designed. The arising circuit is very space saving on the one hand, and a possible mismatch between the components may be compensated for, on the other hand, since the substantial analog devices are used jointly.

If the offset is compensated in the usual way with a DAC in the digitization of analog measurement signals imparted with high offset signals, before the remaining residual signal is digitized with an ADC, a mismatch inevitably occurs. This is due to the fact that the offset is corrected by the DAC with a resolution different from the resolution of the ADC, and performs the actual digitization and modulation of the signal to be measured. As shown in FIG. 1c, this mismatch may be avoided, according to some embodiments of the present invention.

Here, on the one hand, FIG. 1c shows the ADC 25 from FIG. 1b, by means of which the digital output signal 52 is generated from the analog measurement signal 30.

The components corresponding to the ones in FIGS. 1a and 1b are provided with the same reference numerals in FIG. 1c. Hence, the explanations concerning the individual components from these figures and the statements made with respect to FIG. 1c also are mutually applicable to each other.

As it can be taken from FIG. 1c, the analog filter 36 and the digital-analog converter 46 now are used both by the offset compensation and by the analog-to-digital conversion of the ΣΔ converters. Hence, the advantage that these components do not have to be implemented multiple times, so that both space on the chip and energy can be saved in operation results, on the one hand. This is achieved by the fact that the digital feedback signal 44 and the quantized M-bit signal 10 of the DAC are added in the digital domain within the feedback loop of the ADC 25, so that DAC 46 generates a correction quantity including both the calibration proportion and the modulation proportion of the analog-to-digital converter 25.

As opposed to previous readout circuits including an integrator, one or more DA converters for calibration and an ADC, the number of the components needed can be reduced significantly in the embodiment of an analog-to-digital converter 150. When using ΣΔ converters, extremely high accuracy of the conversion can be achieved. Moreover, the circuits shown in FIG. 1c and/or the principle outlined there avoids a mismatch of the components needed, when an analog measuring quantity imparted with a high offset proportion has to be measured and digitized.

This is achieved by using an analog-to-digital converter 150 comprising a compensation means 152 to impart an analog measured quantity 30 with a correction quantity dependent on a combination signal 154, so that a changed measured quantity 156 is formed. The analog-to-digital converter 150 further comprises an analog filter 158 filtering the changed measured quantity 156. A digitizer 40 (ADC) generates a digital value 162 depending on the filtered measured quantity 160. The analog-to-digital converter 150 further comprises a feedback means 164 to form the combination signal 154 through combination of a digital calibration value 10 and the digital value 162.

By the combination of the calibration value and the digital value in the feedback means, the advantages of the lower complexity and higher accuracy and/or better dynamical matching can be achieved.

By utilizing the feedback means 164 and a common DAC 46, the value of the LSB (least significant bit) for the DAC and the ADC is identical. Thereby, system-induced deviations between the DAC and the ADC are eliminated. This significantly simplifies later computation of the data. In the case of high offset, it is advantages to define the DAC as a multi-bit converter to enable a moderate oversampling frequency. A greater number of bits does not have such serious effects on the DAC as on an ADC, where a comparator and an attendant reference signal have to be provided in the flash converter for each possible conversion stage, for example. With respect to the energy and chip area to be expanded, it therefore is desirable to be able to use an ADC with minimum resolution possible.

Figure 2:
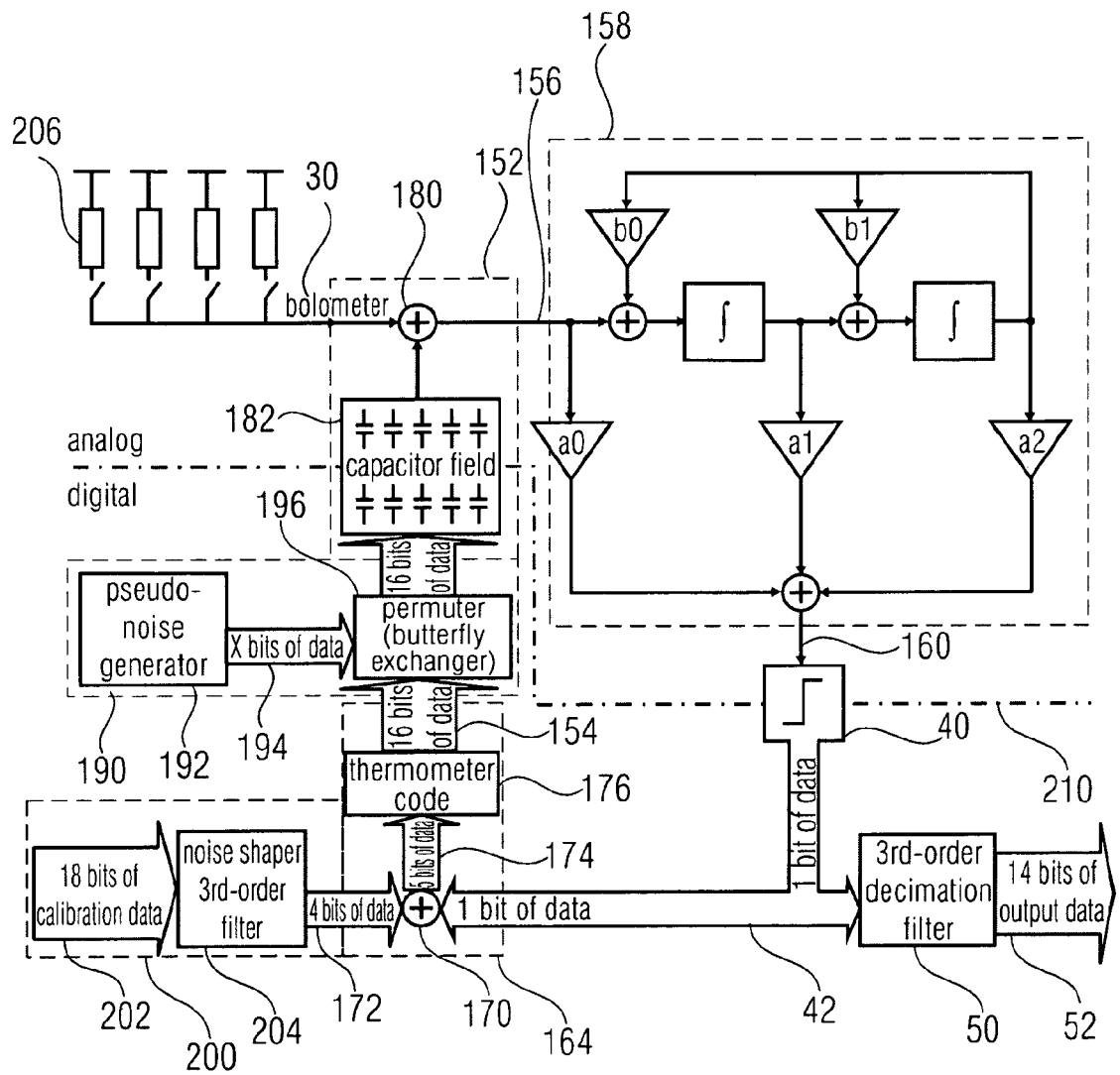
FIG. 2 shows a further embodiment of an analog-to-digital converter.

In the embodiment of FIG. 2 discussed in the following and particularly suited for reading out bolometers, the conversion range of the ADC is 16 times larger than that of the DAC. Due to the typically especially high offset of bolometers, the ratio may be increased even further. FIG. 2 shows an embodiment for reading out the current generated by a bolometer as an analog measured quantity 30. In this embodiment, the analog filter 158 is realized by a second-order integrator integrating and/or filtering the changed measured quantity 156 imparted with a correction quantity by the compensation means 152, in order to apply a filtered measured quantity 160 to the input of a 1-bit analog-to-digital converter 40. The 1-bit converter 40 (comparator) generates a data stream of bits, which are 0 or 1 each, depending on whether the filtered measured quantity 160 at the input of the analog-to-digital converter 40 is greater or smaller than a reference value. In the embodiment shown in FIG. 2, the decimation filter 50 is a third-order decimation filter serving to generate a digitized output signal 52 from the oversampled 1-bit signal of the analog-to-digital converter 40 by way of decimation.

The digital value and/or the digital output signal 42 of the analog-to-digital converter 40 is added to a digital calibration value 172 within the feedback means 164 by an adder 170. In the case shown in FIG. 2, the digital output signal 42 has a resolution of one bit, and the digital calibration value 172 has a resolution of 4 bits. Thus, a 5-bit data word 174, which is transformed into a thermometer code 176, is generated by the adder 170. In the simple embodiment shown in FIG. 2, the thermometer code represents the 16 possible values of the 5-bit data word 174 by 16 lined-up bits, which may be 0 or 1 each, wherein the number of the 1-bits corresponds to the number of the 5-bit data word. The thermometer code 176 may directly be used as a combination signal to generate the correction quantity dependent on the combination signal by means of the compensation means 152, as will be described briefly in the following.

In the case shown in FIG. 2, the compensation means 152 includes a summing node (adder) 180 at which all currents are summed up, and a correction generator 182. The correction generator again includes a capacitor array with 16 capacitors of nominally identical capacitance. The thermometer code 176 designates those capacitors the charge of which is to be accumulated to generate the correction quantity added to the analog measuring quantity 30 at the summing node 180. Here, every digit of the 16-bit data word is uniquely associated with a specific capacitor. If the bit of the digit concerned is 1, the capacitor is used, if it is 0, the capacitor is not used. The correction quantity added to the analog measurement signal 30 thus includes both a proportion originating from a calibration, i.e. describing the expected stored amount of the offset, and a proportion originating from the modulation principle underlying the $\Sigma\Delta$ conversion.

In the case shown in FIG. 2, the compensation means 182 additionally comprises an optional random means 190, which makes different combinations of capacitors of the capacitor array 182 to be used each, with identical thermometer code 176. To this end, a random permutation of the 16 bits of the thermometer code 176 is performed in a permuter 196 on the basis of a random number 194 generated by a noise generator 192, so that capacitance differences of the nominally identical capacitors of the capacitor array 182, caused by variations of the parameters during the production of an integrated circuit, cannot corrupt the measurement result. This is achieved by the fact that different combinations of capacitors are switched, so that the inevitable capacitance differences filter each other out through the oversampling and the noise-shaping property of the $\Sigma\Delta$ modulator accompanied thereby.

The feedback means 64 of the embodiment shown in FIG. 2 of an analog-to-digital converter further comprises an optional providing means 200 for the calibration value 172, which includes a memory for storing a predetermined calibration value 202 and a noise-shaper filter 204 for reducing the resolution of the stored predetermined calibration value 202. In the case shown in FIG. 2, the calibration value 202 predetermined from the calibration of the detector 206 to be read out (bolometer or bolometer array) is determined with a resolution of 18 bits. The noise-shaper filter 204 serves to reduce the resolution to the four bits of the calibration value 172 that can still be processed by the digital-to-analog converter. In connection with the oversampling, the noise-shaper filter 204 ensures that, on average, the calibration value 172 corresponds to the predetermined calibration value 202 of the higher resolution.

In summary, the embodiment shown in FIG. 2 of an analog-to-digital converter, thus may be characterized as follows. The digital data of the noise-shaper and the $\Sigma\Delta$ ADC are added. Same are converted into a thermometer code defining the number of capacitors to be switched on, and it is decided, via a pseudo-random function, which capacitors are switched out of the capacitor matrix. With the same input value, different combinations of capacitors are switched. Thereby, deviations may be filtered out. The deviations of the capacitances have an effect as higher-frequency disturbances above the signal band and are suppressed by the decimation filter 50. As it is shown in FIG. 2, in the embodiment described there, the integrators of the analog filter 158 are used both by the DAC and by the ADC. The two integrators here need an operational amplifier each. In general, it is part of the concept that both ADC and DAC use the analog circuit components jointly, which is once again made clear by the separation line 210 drawn between the analog and the digital domain.

In the case shown in FIG. 2, the dynamic range of the ADC additionally may be limited substantially by the multi-bit DAC, so that same may be implemented as a simple comparator in the end.

The embodiment shown in FIG. 2 has the advantage of a significantly reduced number of circuit elements. A conventional readout circuit with an integrator and a CDS stage already has a similar complexity as the circuits shown in FIG. 2. An ADC and a DAC are added thereto, however, which are already integrated in the circuit presented. The embodiment shown in FIG. 2 thus allows for especially efficient realization of the analog-to-digital conversion of analog measurement signals imparted with high offset. Moreover, perfect matching of the offset equalization and the analog-digital conversion is achieved by using all analog components together, which leads to better accuracy of the result.

A simplification as opposed to conventional readout circuits further could result by the fact that the ADC in normal ΣΔ ADCs has to be capable of outputting both positive and negative reference signals, or adding or subtracting a charge Q depending on the digital input signal. Since, in the case shown in FIG. 2 current flow takes place only in one direction, it is sufficient to construct the DAC so that it can add or subtract the charge, depending on the direction of the current flow of the sensor used. By way of this simplification, the number of devices may be reduced additionally, accompanied by area reductions of the semiconductor area needed for the ΣΔ ADC.

Figure 3:
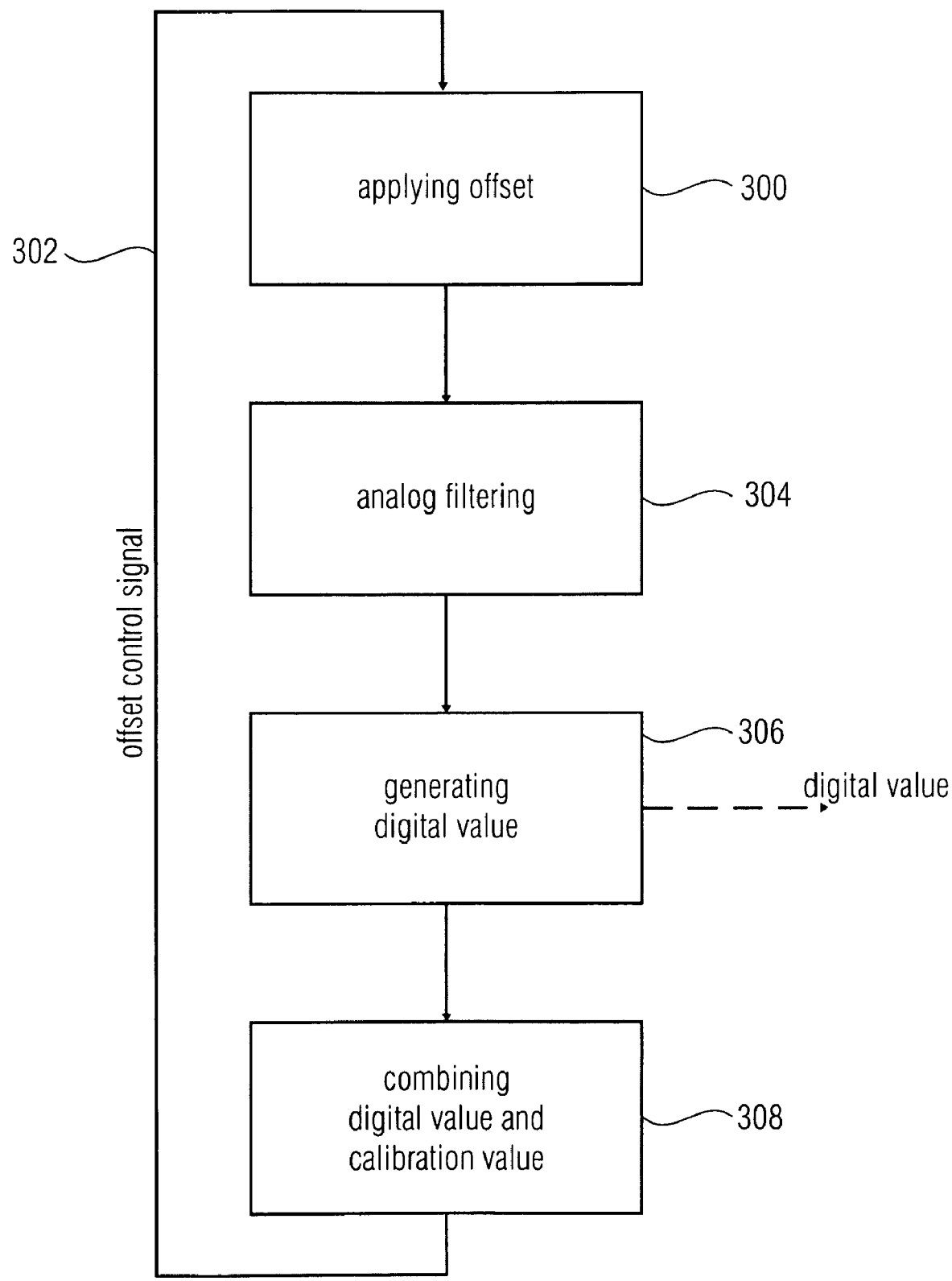
FIG. 3 shows an embodiment of a method for analog-to-digital conversion.

FIG. 3 shows an embodiment of a method for analog-to-digital conversion, which comprises the following steps. In a correction step 300, an analog measured quantity is imparted with a correction quantity dependent on a combination signal 302 to form a changed measured quantity.

The changed measured quantity is filtered by an analog filter in a filtering step 304 to obtain a filtered measured quantity. The filtered measured quantity is digitized in a digitizing step 306 to obtain a digital value.

In a feedback step 308, a digital calibration value is combined with the digital value to form the combination signal 302, which is supplied to the compensation means 300.

In the case of evaluating measurement signals from bolometers with one of the embodiments according to the invention, the quantization of the possible correction quantities as shown in FIG. 2 can be utilized in an especially advantageous manner so as to compensate for the inherent self-heating of the bolometer elements by the readout. By way of the strongly differing resistances of the individual bolometer elements, also different self-heating in the readout occurs.

This self-heating could not be corrected in conventional readout methods, and/or it could not be determined. Different self-heating may be regarded as an additional offset to be corrected. For this reason, offset equalization has to take place again and again during the operation or continuous operation of a bolometer or bolometer array.

The self-heating of a bolometer, however, can be detected very easily by the embodiments according to the invention or the readout circuit from FIG. 2, especially through the number of switching processes in the capacitor array in connection with the property of the quantized correction quantities. Since the current at the input of the analog filter 158 is regulated by the feedback, the current flowing through a bolometer element on average corresponds to the current given off by the capacitor array 182. From this, the charge, and hence the energy supplied to the bolometer during the readout cycles, can be calculated easily, as shown by the following formula:

$$W = U \cdot \sum_{n=1}^{N} i_n \cdot q$$

W: Energy supplied to the bolometer
U: Voltage across the bolometer
N: Number of cycles
$i_n$: Number of the switched capacitors and polarity thereof in the cycle n
q: Charge on the capacitor Hence, with knowledge of the power consumed in the bolometer during the readout, heating that can be used for correcting the readout result can be calculated on the basis of a theoretical model.

If the above-described procedure of using a blind bolometer for offset equalization is chosen, the self-heating can be compensated in an alternative way, since the measurement ends after a fixed number of charge transfers by the capacitors, and it therefore is known what amount of energy was supplied to the measuring bolometer. Depending on which of the two bolometers to be compared has been supplied with more energy, the less heated bolometer may still be operated with even further measurement cycles until the self-heating of both bolometers is equal, since the two have been supplied with the same amount of energy. Hence, energy supplied during the readout is identical for all bolometers and the blind bolometers can be used with higher accuracy than before as a reference. This may also be extended to all bolometers of an array, so that each bolometer is supplied with equal energy.

The previously described embodiments of an analog-to-digital conversion thus additionally allow for previously impossible, very simple detection of the self-heating of bolometers and/or sensors read out by means of the analog-to-digital converters.

Instead of several capacitors, like in FIG. 2 (182), less capacitors may also be used, which are instead switched at a higher frequency than the sampling rate of the sigma-delta converter. They transfer the same overall charge in temporally successive steps. Instead of n capacitors, less capacitors thus may be used, e.g. n/x capacitors, which are switched x times. The number of charge transfers stays the same as compared with the transfers performed in the capacitor array. In a particular embodiment, a capacitor capable of performing n charge transfers per clock of the sigma-delta converter is used.

It goes without saying that not only the capacitors shown in FIG. 2 may be used for generating a correction quantity. Rather, current sources and sinks, as well as voltage sources may be used, for example, to generate a suitable correction quantity. Alternatively, also a resistor array may be used, which can be switched in arbitrary combination, so that a variable reference current is generated in the case of a default reference voltage. It also is not essential for the correction quantity to be generated from quantized values. Rather, it is equally possible to continuously generate the correction quantities.

Although embodiments of analog-to-digital converters have been discussed previously mostly in connection with the readout of bolometers, the concept according to the invention of the analog-to-digital conversion is not limited to the readout of bolometers, of course. Rather, any sensor may be read out, or any analog measurement signal (voltage, current) can be digitized by means of the concept for analog-to-digital conversion. The concept is particularly suited for digitizing analog measurement signals having a high offset.

For example, pressure sensors, light sensors, gas sensors, humidity sensors, or the like are examples of further sensors that can be read out with the concept according to the invention.

Depending on the conditions, the method of analog-to-digital conversion may be implemented in hardware or in software. The implementation may be on a digital storage medium, particularly a floppy disc or CD with electronically readable control signals capable of cooperating with a programmable computer system so that the inventive method of analog-to-digital conversion is executed. In general, the invention thus also consists in a computer program product with program code stored on a machine-readable carrier for performing the inventive method, when the computer program product is executed on a computer. In other words, the invention may thus be realized as a computer program with a program code for performing the method, when the computer program is executed on a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An analog-to-digital converter, comprising:
a compensator for imparting an analog measured quantity with a correction quantity dependent on a combination signal to form a changed measured quantity;
an analog filter for filtering the changed measured quantity to acquire a filtered measured quantity;
a digitizer to generate a digital value dependent on the filtered measured quantity; and
a feedback unit to form the combination signal by adding a digital calibration value and the digital value.

2. The analog-to-digital converter according to claim 1, wherein the compensator comprises a correction generator to generate the correction quantity.

3. The analog-to-digital converter according to claim 1, wherein the compensator is formed to add or subtract the correction quantity and the analog measured quantity.

4. The analog-to-digital converter according to claim 1, wherein the analog filter is a first-order integrator.

5. The analog-to-digital converter according to claim 1, wherein the analog filter is a higher-order integrator.

6. The analog-to-digital converter according to claim 1, wherein the digitizer comprises a resolution smaller than or equal to 4 bits.

7. The analog-to-digital converter according to claim 1, wherein the digitizer comprises a resolution of one bit.

8. The analog-to-digital converter according to claim 1, with a decimation filter to generate a digital measurement value with predetermined resolution from the digital value, the predetermined resolution exceeding a resolution of the digital value.

9. The analog-to-digital converter according to claim 1, wherein the feedback unit comprises a provider for the digital calibration value to provide the digital calibration value with a resolution exceeding the resolution of the digitizer.

10. The analog-to-digital converter according to claim 9, wherein the provider comprises:
a memory for storing a predetermined calibration value, the resolution of which is greater than the resolution of the digital calibration value; and
a noise-shaper filter to generate the digital calibration value with reduced word width from the predetermined calibration value.

11. The analog-to-digital converter according to claim 10, wherein the noise-shaper filter is formed to generate the digital calibration value with such a reduced word width that the combination signal generated by the feedback unit comprises a word width capable of uniquely describing a possible number of correction quantities.

12. An analog-to-digital converter, comprising:
a compensator for imparting an analog measured quantity with a correction quantity dependent on a combination signal to form a changed measured quantity;
an analog filter for filtering the changed measured quantity to acquire a filtered measured quantity;
a digitizer to generate a digital value dependent on the filtered measured quantity; and
a feedback unit to form the combination signal by combination of adding a digital calibration value and the digital value,
wherein the compensator comprises a correction generator to generate the correction quantity, and
wherein the correction generator comprises a plurality of signal generators, wherein the correction generator is formed to form the correction quantity by combination of a number of signals of the signal generator indicated by the combination signal.

13. The analog-to-digital converter according to claim 12, wherein the signal generators generate a current or a voltage.

14. The analog-to-digital converter according to claim 12, wherein the signal generators each comprise a capacitor, a current source, a voltage source, or a resistor.

15. The analog-to-digital converter according to claim 12, wherein the correction generator is formed to combine a first subset of the signal generators in the case of a first combination signal indicating a predetermined number of signal generators, and to combine a second subset of the signal generators, different from the first subset, in the case of a second combination signal indicating the predetermined number of signal generators.

16. The analog-to-digital converter according to claim 12, wherein the feedback unit is formed to generate, as combination signal, a number of bits corresponding to the number of signal generators, wherein each bit is uniquely associated with a signal generator, and a selected bit state indicates the use of the corresponding signal generator for the combination.

17. The analog-to-digital converter according to claim 16, wherein the compensator comprises a random generator to generate a random permutation of the number of bits.

18. A method for analog-to-digital conversion, comprising:
imparting an analog measured quantity with a correction quantity dependent on a combination signal, to form a changed measured quantity;
analog filtering of the changed measured quantity to acquire a filtered measured quantity;
generating a digital value depending on the filtered measured quantity; and
generating the combination signal by adding of a digital calibration value and the digital value.

19. The method according to claim 18, further comprising generating a digital measurement value with predetermined resolution from the digital value, the predetermined resolution exceeding a resolution of the digital value.

20. A bolometer sensor, comprising
a sensor element for generating an analog measured quantity depending on received heat radiation; and
an analog-to-digital converter comprising:
a compensator for imparting an analog measured quantity with a correction quantity dependent on a combination signal to form a changed measured quantity;
an analog filter for filtering the changed measured quantity to acquire a filtered measured quantity;
a digitizer to generate a digital value dependent on the filtered measured quantity; and
a feedback unit to form the combination signal by adding of a digital calibration value and the digital value.

21. The bolometer sensor according to claim 20, wherein the analog-to-digital converter further comprises a decimation filter to generate a digital measurement value with predetermined resolution from the digital value, the predetermined resolution exceeding a resolution of the digital value.

22. An analog-to-digital converter, comprising:
- a compensator for imparting an analog measured quantity with a correction quantity dependent on a combination signal to form a changed measured quantity;
- an analog filter for filtering the changed measured quantity to acquire a filtered measured quantity;
- a digitizer to generate a digital value dependent on the filtered measured quantity;
- a feedback unit to form the combination signal by combination of a digital calibration value and the digital value; and
- a decimation filter to generate a digital measurement value with predetermined resolution from the digital value,
- wherein the predetermined resolution exceeds a resolution of the digitizer which, in turn, is smaller than or equal to 4 bits.

23. The analog-to-digital converter according to claim 22, wherein the resolution of the digitizer is one bit.

24. An analog-to-digital converter, comprising:
- a compensator for imparting an analog measured quantity with a correction quantity dependent on a combination signal to form a changed measured quantity;
- an analog filter for filtering the changed measured quantity to acquire a filtered measured quantity;
- a digitizer to generate a digital value dependent on the filtered measured quantity;
- a feedback unit to form the combination signal by combination of a digital calibration value and the digital value; and
- a decimation filter to generate a digital measurement value with predetermined resolution from the digital value,
- wherein the predetermined resolution exceeds a resolution of the digitizer, and
- wherein the feedback unit comprises a provider for the digital calibration value to provide the digital calibration value with a resolution exceeding the resolution of the digitizer.

25. The analog-to-digital converter according to claim 24, wherein the resolution of the digitizer is smaller than or equal to 4 bits.

* * * * *